United States Patent [19]

Ito et al.

[11] 4,333,842
[45] Jun. 8, 1982

[54] PIEZOELECTRIC SINGLE CRYSTAL AND SURFACE ACOUSTIC WAVE ELEMENT EMPLOYING THE SAME

[75] Inventors: Yukio Ito, Kokubunji; Kazuyuki Nagatsuma; Sigeru Jyomura, both of Hachioji; Sakichi Ashida, Fuchu; Hiroshi Takeuchi, Matsudo, all of Japan

[73] Assignee: Hitachi, Ltd., Tokyo, Japan

[21] Appl. No.: 178,593

[22] Filed: Aug. 15, 1980

[30] Foreign Application Priority Data

Aug. 22, 1979 [JP] Japan .............................. 54-106097

[51] Int. Cl.$^3$ ............................................. C04B 35/00
[52] U.S. Cl. ................................. 252/62.9; 310/358; 310/313 A; 423/331
[58] Field of Search .............. 252/62.9; 310/313, 358; 423/331, 326

[56] References Cited

U.S. PATENT DOCUMENTS

2,974,203  3/1961  Flaschen et al. ................... 252/62.9
4,233,282  11/1980  Arendt ............................... 252/62.9

OTHER PUBLICATIONS

Ito, Y. et al., "Surface Acoustic Wave Characteristics of $(Ba_{2-x}Sr_x)TiSi_2O_8$ Crystals", Applied Physics Letters, vol. 80, 36(11), pp. 894-895.

Primary Examiner—J. D. Miller
Assistant Examiner—D. L. Rebsch
Attorney, Agent, or Firm—Craig and Antonelli

[57] ABSTRACT

A piezoelectric single crystal which has a composition represented by a general formula $(Ba_{2-x}Sr_x)TiSi_2O_8$, the value x lying within a range of $0.25 \leq x \leq 1.2$; and a surface acoustic wave element which is so constructed as to employ surface waves that propagate on a cut plane perpendicular to the Z-axis of the single crystal, or surface waves that propagate in a specified direction on a cut plane containing the X-axis of the single crystal. The piezoelectric single crystal and the surface acoustic wave element employing it have the merits that the electromechanical coupling factor of the surface acoustic waves is great and that the temperature coefficient of delay time of the surface acoustic waves is small.

2 Claims, 8 Drawing Figures

PIEZOELECTRIC SINGLE CRYSTAL AND SURFACE ACOUSTIC WAVE ELEMENT EMPLOYING THE SAME

BACKGROUND OF THE INVENTION (i) Field of the Invention

This invention relates to a piezoelectric single crystal for use in ultrasonic vibrators etc., particularly surface acoustic wave elements, and also to a surface acoustic wave element employing the single crystal.

(ii) Brief Description of the Prior Art

At present, various sorts of piezoelectric single crystals are known. Among them, typical single crystals are quartz, $LiNbO_3$, $LiTaO_3$, $Ba_2TiSi_2O_8$, etc. These single crystals are properly used according to purposes as their characteristics have both merits and demerits.

The quartz crystal is applied extensively to piezoelectric vibrators etc. Although the temperature characteristic of the quartz crystal is good, the piezoelectric activity is comparatively low, and the electromechanical coupling factor of the thickness vibration as is a constant representative of piezoelectricity is approximately 10%. Regarding the surface acoustic wave properties, the temperature coefficient of delay time is substantially 0 ppm/°C. and is good, but the electromechanical coupling factor $k_s^2$ is as small as $\sim 0.1\%$ and is poor. On the other hand, the $LiNbO_3$ crystal exhibits a high piezoelectric activity, but it has the disadvantage of a poor temperature characteristic. That is, although the electromechanical coupling factor of the thickness-shear vibration of an X-cut plate is as great as 60–70%, the temperature coefficient of the resonance frequency is as great as 70–90 ppm/°C. Regarding the surface acoustic wave properties, the electromechanical coupling factor is approximately 5% and is excellent, whereas the temperature coefficient of delay time exhibits a large value of 70–90 ppm/°C. unpreferably.

The $LiTaO_3$ and $Ba_2TiSi_2O_8$ single crystals have characteristics intermediate between those of the aforecited two crystals. The electromechanical coupling factor of the thickness-shear vibration of the $LiTaO_3$ single crystal of an X-cut plate is approximately 47%, and the temperature coefficient of the resonance frequency is approximately 11 ppm/°C. The electromechanical coupling factor and temperature coefficient of surface acoustic wave (SAW) delay time are approximately 0.7% and approximately 22 ppm/°C., respectively. On the other hand, the electromechanical coupling factor of the thickness-shear vibration of a bulk in the $Ba_2TiSi_2O_8$ single crystal of a (110)-cut plate is approximately 28%, and the temperature coefficient of the resonance frequency is approximately 33 ppm/°C. The electromechanical coupling factor and temperature coefficient of delay time are approximately 1.5% and approximately 50 ppm/°C., respectively.

As materials for SAW devices, besides the piezoelectric single crystals referred to above, there are employed ceramics, piezoelectric thin films etc. The SAW devices employing the ceramics or the thin films, however, have the difficulty that dispersions and secular changes in the characteristics thereof are great.

In case where the temperature coefficient of SAW delay time is great, fluctuations in the characteristics of an SAW device employing the piezoelectric single crystal as are ascribable to temperature changes become great unpreferably. In case where the electromechanical coupling factor is small, a broad-band SAW device employing the piezoelectric single crystal has the disadvantage that the insertion loss increases.

Further, the $LiNbO_3$ and $LiTaO_3$ crystals are ferroelectric materials, resulting in the disadvantages that the poling must be carried out for their uses in SAW elements.

On the other hand, the $Ba_2TiSi_2O_8$ single crystal having the mineral designation of "fresnoite" possesses, as stated previously, the comparatively good characteristics that the electromechanical coupling factor of surface acoustic waves is somewhat high and that the temperature coefficient of delay time is somewhat small. Further, the $Ba_2TiSi_2O_8$ single crystal has the merits that it does not require the poling because it is not a ferroelectric material and that it can be used even under a high temperature condition because its melting point is approximately 1,400° C. Since the $Ba_2TiSi_2O_8$ single crystal has a dielectric constant of at most 15, it has a small electrical capacity, and it can be used up to high frequencies when applied to SAW elements.

In general, characteristics desired for a piezoelectric single crystal to be used in an SAW element are at least 0.6% in the electromechanical coupling factor $k^2$ and at most 50 ppm/°C. in the temperature coefficient of delay time. The latter is more favorable as it is smaller.

The following references are cited to show the state of the art: (i) Japanese Published Unexamined Patent Application No. 48-98397, (ii) Japanese Published Unexamined Patent Application No. 51-103792, (iii) Japanese Published Unexamined Patent Application No. 53-68189.

SUMMARY OF THE INVENTION

An object of this invention is to provide a piezoelectric single crystal whose electromechanical coupling factor for surface acoustic waves is great and whose temperature coefficient of delay time is still smaller than in the prior art, and also to provide an SAW element having the characteristics that the electromechanical coupling factor is great and that the temperature coefficient of delay time is still smaller than in the prior art.

In order to accomplish the object, a piezoelectric single crystal according to this invention has a composition which is represented by a general formula $(Ba_{2-x}Sr_x)TiSi_2O_8$ and in which the value x falls within a range of $0.25 \leq x \leq 1.2$. In case where the value x is smaller than 0.25, the temperature coefficient of delay time does not become very small. In case where the value x is greater than 1.2, it becomes difficult to produce the single crystal of a single phase. Both the cases are unfavorable.

In case where the value x falls within a range of $0.5 \leq x \leq 1.0$, the temperature coefficient of delay time is sufficiently small, and the production of the single crystal is easy, so that a more preferable result is obtained. The piezoelectric single crystal of this invention is a solid solution which consists of the two components of $Ba_2TiSi_2O_8$ and $Sr_2TiSi_2O_8$.

The piezoelectric single crystal according to this invention constructed as above described is great in the electromechanical coupling factor for surface acoustic waves and remarkably small in the temperature coefficient of delay time, and it exhibits good characteristics especially as a material for use in SAW devices. FIG. 1 shows the relationship between the temperature coefficient of delay time for surface waves and the value x as to a Z-cut plate of the single crystal of the composition represented by the general formula $(Ba_{2-x}Sr_x)TiSi_2O_8$, and the details will be described later. The propagating direction of the surface acoustic waves in this case is at 45° with respect to the X-axis on the Z-cut plane. As apparent from FIG. 1, the temperature coefficient of delay time of the surface waves lowers conspicuously with the increase of the Sr content x. It becomes about 35 ppm/°C. or less for x of or above 0.5, and it becomes about 30 ppm/°C. for x of or above 0.6. According to the result of a measurement on the surface acoustic waves propagating in the direction of 45° with respect to the X-axis on the Z-cut plate of the single crystal, the electromechanical coupling factor is great and holds a value of 1.5–1.9%. Further, the dielectric constant of the piezoelectric single crystal is about 15. While, in the above, the surface acoustic wave properties of the piezoelectric single crystal of this invention have been described, properties on the thickness-shear vibration are also excellent as understood from examples to be stated later.

An SAW element of this invention having the characteristics that the electromechanical coupling factor is great and that the temperature coefficient of delay time is small uses as its substrate the piezoelectric single crystal described above, i.e., the single crystal having the composition which is represented by the general formula $(Ba_{2-x}Sr_x)TiSi_2O_8$ and in which the value x lies within the range of $0.25 \leq x \leq 1.2$, preferably the range of $0.5 \leq x \leq 1.0$, and it employs (i) surface acoustic waves which propagate on a cut plane perpendicular to the Z-axis of the single crystal, (ii) surface acoustic waves which propagate on a cut plane containing the X-axis of the single crystal and in a direction parallel to the X-axis, or (iii) surface acoustic waves which propagate on a cut plane containing the X-axis of the single crystal and in a direction perpendicular to the X-axis, the cut plane being such that an angle $\mu$ defined between a direction perpendicular to this cut plane and the Z-axis of the single crystal lies in a range of $|\mu| < 30°$. In addition, an SAW element that employs (iv) in the surface acoustic waves (ii), especially surface acoustic waves which propagate on such a cut plane that an angle $\mu$ defined between a direction perpendicular to the cut plane of the single crystal and the Z-axis of the single crystal lies in a range of $|\mu| < 70°$ exhibits a great electromechanical coupling factor. Further, the element employing the surface acoustic waves (i) has the advantage that the surface acoustic wave properties scarcely fluctuate due to deviations in the propagating direction of the surface acoustic waves. The element employing the surface acoustic waves (iii) exhibits an especially great electromechanical coupling factor when $|\mu| < 20°$.

FIGS. 5, 6 and 7 are explanatory views showing the cut planes of the single crystal and the propagating directions of the surface acoustic waves. Numeral 1 designates the substrate, letters X, Y and Z the crystal axis coordinates respectively, symbol $\vec{k}$ the propagating direction of the surface acoustic waves, letter $\mu$ the Euler angle defined between the direction perpendicular to the the cut plane and the Z-axis, and letter $\theta$ the Euler angle defined between the propagating direction of the surface acoustic waves and the X-axis. FIG. 5 corresponds to the case (iii), FIG. 6 the case (i), and FIG. 7 the case (ii).

FIG. 4 is a graph showing the relationships between the temperature coefficient of delay time of the surface acoustic waves, the electromechanical coupling factor and the SAW velocity, and the Euler angle. Part (a) in FIG. 4 corresponds to the case of FIG. 5, part (b) the case of FIG. 6, and part (c) the case of FIG. 7. In FIG. 4, numerals 11, 21 and 31 illustrate cases of a composition with x being 0, numerals 12, 22 and 32 cases of a composition with x being 0.3, numerals 13, 23 and 33 cases of a composition with x being 0.5, numerals 14, 24 and 34 cases of a composition with x being 0.6, numerals 15, 25 and 35 cases of a composition with x being 0.8, and numerals 16, 26 and 36 cases of a composition with x being 1.0. FIG. 4 will be described more in detail in the example later.

As apparent from FIG. 4, the SAW element according to this invention constructed as above described is such that the temperature coefficient of delay time of the surface acoustic waves decreases remarkably with the increase of the Sr content in the single crystal constituting the element. In case where Sr is contained in the crystal, the electromechanical coupling factor demonstrates a tendency to somewhat increase. Besides, the dielectric constant of the single crystal used in the element of this invention is approximately 15 and is low to the same extent as that of the $Ba_2TiSi_2O_8$ single crystal. Accordingly, the excellent SAW element which has a broad band at high frequencies and exhibits a high stability against temperature changes and which has not hitherto been realizable is provided by this invention.

It is also apparent from FIG. 4 that the characteristics of the SAW elements according to this invention as have the cut planes and the propagating directions of the surface acoustic waves are excellent. That is, the elements which have the cut planes and the propagating directions of the surface acoustic waves as indicated in the case (i) (part (b)), the case (ii) (part (c)) and the case (iii) (range of $\mu < 30°$ in the part (a)) exhibit small temperature coefficients of delay time and great electromechanical coupling factors. In the case (iv) (range of $\mu < 70°$ in the part (c)), the electromechanical coupling factors are still greater. The surface acoustic wave properties in the case (i) are almost constant independently of the angles $\theta$ indicative of the propagating directions of the surface acoustic waves. In the case (iii), the electromechanical coupling factors become particularly great when $\mu < 20°$ is set.

Means to cause surface acoustic waves to propagate in a predetermined direction on a specified cut plane on a substrate have been well known in the art, and any of the known means may be employed in this invention. By way of example, as illustrated in FIG. 8, two sets of interdigital electrodes 82 and 83 made of Al or the like are formed on the surface of a piezoelectric single crystal substrate 81 by the well-known photoetching, A.C. power is applied from an A.C. source 84 to one electrode 82 so as to excite surface acoustic waves, and a load 85 is connected to the other interdigital electrode 83 so as to receive the waves. Then, the surface acoustic waves propagate in the direction of arrow 86, i.e., in the direction orthogonal to the fingers of the interdigital electrodes 82 and 83. Although the case where the number of pairs in each electrode is 2 is exemplified in FIG. 8, it goes without saying that the number of pairs need not be restricted to 2. The surface acoustic waves which are employed in the SAW elements of this invention become Rayleigh waves.

As set forth above, the piezoelectric single crystal of this invention exhibits the characteristics that the electromechanical coupling factor is great and that the temperature coefficient is small. By employing it, therefore, a good vibrator is obtained. Moreover, it is very excellent in point of the stability against temperature changes as a substrate material which is used in SAW elements for wide bands at high frequencies. In addition, the piezoelectric single crystal of this invention is not a ferroelectric material and therefore requires no poling. Further, the SAW element of this invention which employs as its substrate the excellent piezoelectric single crystal described above and which is constructed so that the surface acoustic waves may propagate in the predetermined direction on the predetermined cut plane has a broad band at high frequencies and exhibits a very excellent stability against temperature changes.

DESCRIPTION OF THE PRESENTLY PREFERRED EMBODIMENTS

EXAMPLE 1

Figure 2:
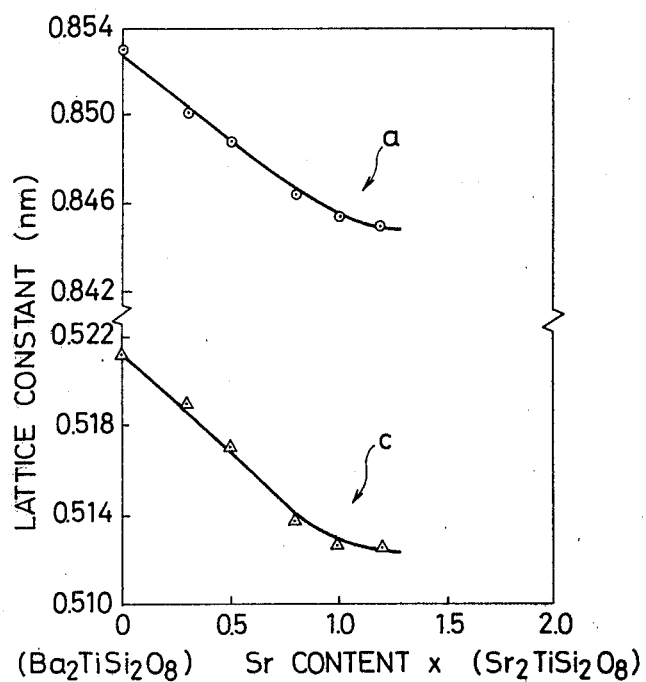
FIG. 2 is a graph showing the relationship between the Sr content and the lattice constant in the piezoelectric single crystal of this invention.

As starting materials, there were employed barium carbonate $BaCO_3$, strontium carbonate $SrCO_3$, titanium oxide $TiO_2$ and silicon oxide $SiO_2$ which had purities of at least 99.9%. Powders of these materials were weighed so as to prepare a composition of a general formula $(Ba_{2-x}Sr_x)TiSi_2O_8$ in which $x=0.3$, and were mixed by an agate mortar for 5 hours. After forming the mixture into a compact, it was calcined at 1,100° C. for 10 hours. The resultant ceramic was used as a matrix for crystal growth. The ceramic was put in a platinum crucible and was molten with an R.F. furnace so as to grow a crystal by the Czochralski technique. The pulling speed and the rotation rate at this time were approximately 1 mm/h and 60 r.p.m., respectively. As a result, a colorless and transparent single crystal in the shape of a circular cylinder having a diameter of 12 mm and a length of 30 mm was obtained. An X-ray diffraction test was conducted, and it was revealed from an X-ray powder diffraction pattern that the crystal is basically in a single phase having the same crystalline structure as that of $Ba_2TiSi_2O_8$. FIG. 2 is a graph showing the relationships between the Sr content x and the lattice constants a and c as obtained by the X-ray diffraction tests of Examples 1–4. From the variations of the lattice constants shown in FIG. 2 wherein the lattice constants c and a decrease substantially rectilinearly with the increase of the Sr content x, it was revealed that the composition system of this invention forms a solid solution. In addition, it was confirmed from an X-ray fluorescence analysis that the composition of the grown crystal was substantially as desired.

A (001)-cut plate (namely, Z-cut plate) whose size was 6 mm×8 mm×2 was cut out of the single crystal thus obtained, and the surface acoustic wave properties thereof were measured. After one surface of the sample was polished to a mirror finish, interdigital electrodes of Al were formed thereon by the photoetching. The resultant plate was used in the measurements.

As a result, the temperature coefficient of delay time of the surface acoustic waves was 40 ppm/°C. under the conditions of a propagation surface (001) and a propagation direction [110] (this corresponds to a case of surface acoustic waves which propagate at an Euler angle $\theta$ of 45° on the Z-cut plane, and the same applies hereunder). This value is small as compared with 51 ppm/°C. of the $Ba_2TiSi_2O_8$ crystal. The coupling factor exhibited a value of 1.6%.

EXAMPLE 2

Using the same method as in Example 1, a single crystal was grown from a melt of a starting composition in which $x=0.5$ in the general formula $(Ba_{2-x}Sr_x)TiSi_2O_8$. The crystal obtained was colorless and transparent, and its size was 18 mm in diameter and 25 mm in length. From the results of X-ray diffraction and X-ray fluorescence analyses, it was revealed that the grown crystal was a solid-solution single crystal of substantially the composition aimed at.

The surface acoustic wave properties of this crystal were investigated. Then, under the conditions of a propagation surface (001) and a propagation direction [110], the temperature coefficient of delay time became a still smaller value of 35 ppm/°C., and the coupling factor became a value of 1.9%.

Also under the conditions of a propagation surface (100) and a propagation direction [010] (this corresponds to a case where $\mu$ is 90° in FIG. 7), the temperature coefficient of delay time exhibited a value of 31 ppm/°C. and became smaller than 38 ppm/°C. of the $Ba_2TiSi_2O_8$ crystal.

EXAMPLE 3

Using the same method as in Example 1, a single crystal was grown from a melt of a starting composition in which $x=0.6$ in the general formula $(Ba_{2-x}Sr_x)TiSi_2O_8$. The crystal obtained was colorless and transparent, and its size was 15 mm in diameter and 35 mm in length.

Figure 3:
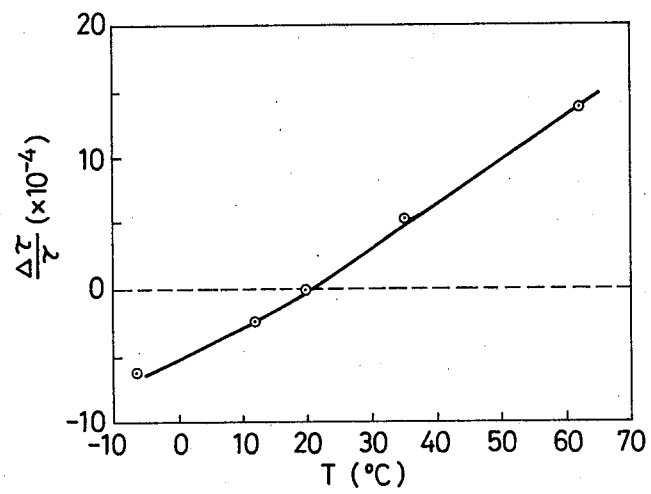
FIG. 3 is a graph showing the situation of temperature-dependent delay time changes of a piezoelectric single crystal in an embodiment of this invention.

The surface acoustic wave properties of this crystal under the conditions of a propagation surface (001) and a propagation direction [110] were 28 ppm/°C. in the temperature coefficient of delay time and 1.7% in the coupling factor. The temperature-dependent variation of the delay time in this case is illustrated in FIG. 3. In the figure, $\tau$ indicates the delay time, $\Delta\tau$ the minute change of the delay time, and T the temperature.

A (110)-cut plate whose size was 5 mm×5 mm×0.3 mm was cut out of the grown crystal, a piezoelectric vibrator was formed, and the coupling factor of a thickness-shear vibration and the temperature coefficient of a resonance frequency was measured. As a result, the temperature coefficient of the resonance frequency was as small as 20 ppm/°C., and the coupling factor exhibited a value of 25%. Thus, also the temperature characteristics of the bulk wave vibrator were found to be good.

EXAMPLE 4

Using the same method as in Example 1, a single crystal was grown from a melt of a starting composition in which $x=0.8$ in the general formula $(Ba_{2-x}Sr_x)TiSi_2O_8$. The crystal obtained was colorless and transparent, and its size was 20 mm in diameter and 25 mm in length. From the results of X-ray diffraction and X-ray fluorescence analyses, it was revealed that the crystal was in a single phase and was a solid solution of substantially the composition aimed at.

Regarding the surface acoustic wave properties, the temperature coefficient of delay time exhibited a value of 23 ppm/°C. and the coupling factor a value of 1.6% under the conditions of a propagation surface (001) and a propagation direction [110].

Figure 1:
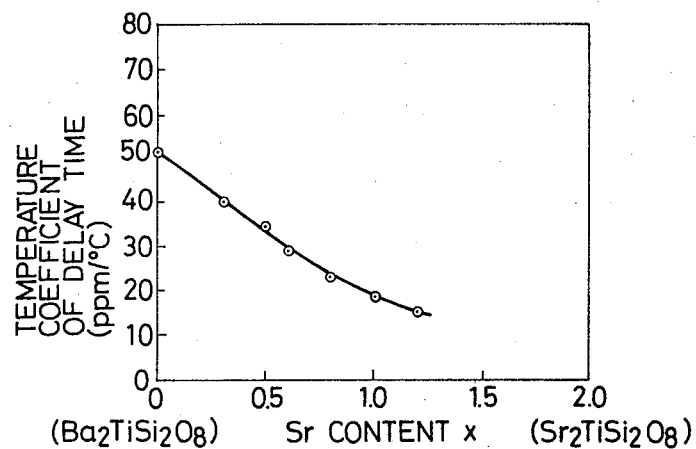
FIG. 1 is a graph showing the relationship between the Sr content and the temperature coefficient of delay time for surface acoustic waves in a piezoelectric single crystal of this invention.

While Examples 1-4 have been described above, it is FIG. 1 that graphically illustrates the relationship between the temperature coefficient of delay time of surface acoustic waves and the Sr content x as to the case of the propagation surface (001) and the propagation direction [110]. As seen from FIG. 1, the delay time-temperature coefficient of the surface acoustic waves in the single crystal of the composition represented by the general formula $(Ba_{2-x}Sr_x)TiSi_2O_8$ decreases remarkably with the increase of the Sr content x, and it becomes 30 ppm/°C. or less at x of or above 0.6. It has been revealed that the coupling factor has a value somewhat greater than 1.5% irrespective of the composition in the case of the propagation surface and the propagation direction described above.

EXAMPLE 5

As starting materials for growing a single crystal for use in a SAW element of this invention, there were employed barium carbonate $BaCO_3$, strontium carbonate $SrCO_3$, titanium oxide $TiO_2$ and silicon oxide $SiO_2$ which had purities of at least 99.9%. Powders of these materials were weighed so as to prepare compositions in which x became 0.3, 0.5, 0.6, 0.8, 1.0 and 1.2 in the general formula $(Ba_{2-x}Sr_x)TiSi_2O_8$. They were mixed by an agate mortar for 5 hours. After forming the mixtures into compacts, they were calcined at 1,100° C. for 10 hours. The resultant compacts were used as matrices for crystal growth. Each compact was put in a platinum crucible and was molten with an R.F. furnace so as to grow a crystal by the Czochralksi technique. The pulling speed and the rotation rate at this time were approximately 1 mm/h and 60 r.p.m., respectively. As a result, colorless and transparent single crystals which had the respective weighed compositions and which were in the shapes of circular cylinders 10-20 mm in diameter and 20-35 mm in length were obtained. X-ray diffraction tests were conducted, and it was revealed from X-ray powder diffraction patterns that the crystals are basically in a single phase having the same crystalline structures as those of $Ba_xTiSi_2O_8$.

When the compositions of the grown single crystals were investigated by the X-ray fluorescence analysis, they were found to be substantially as desired.

Figure 4:
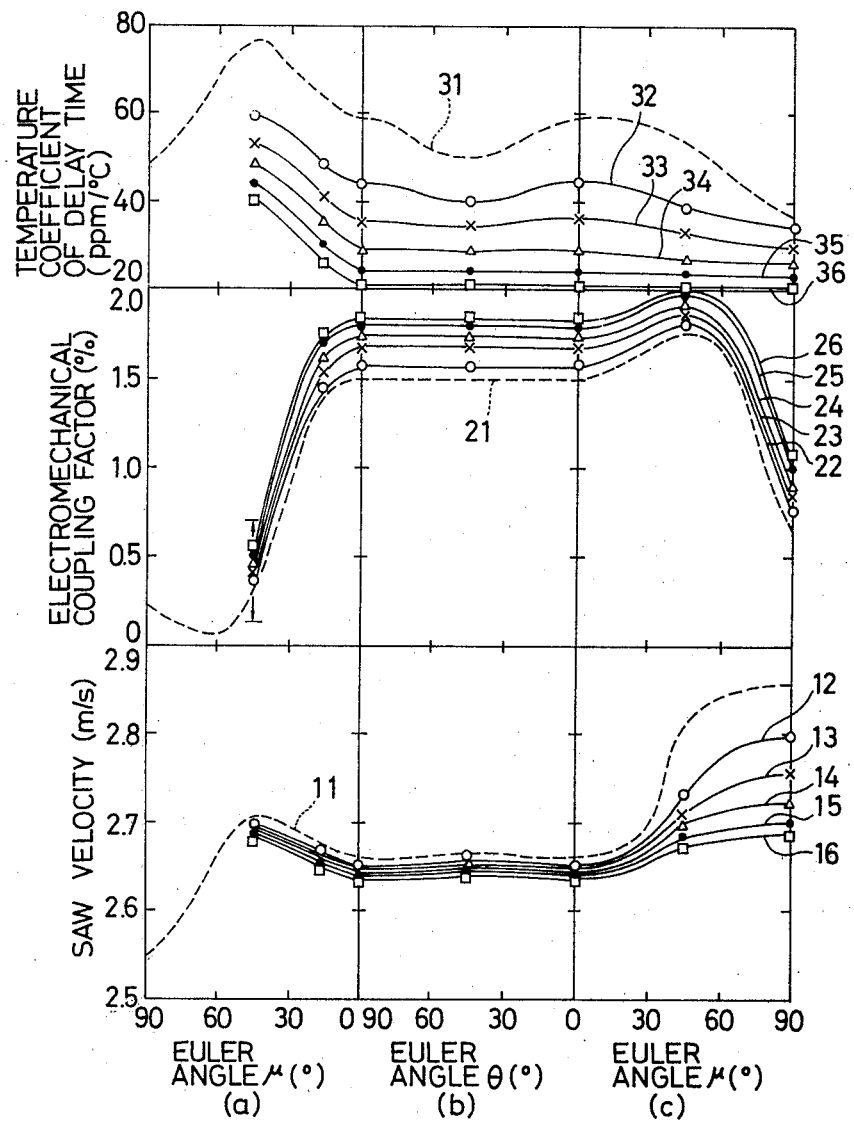
FIG. 4 is a graph showing the relationships between the temperature coefficient of delay time of an SAW element, the electromechanical coupling factor and the SAW velocity, and the Euler angle of the element, with a parameter being the Sr content in a piezoelectric single crystal.
Figure 5:
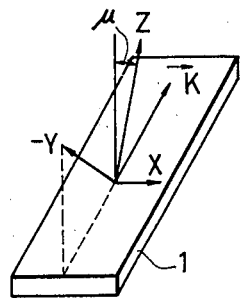
FIGS. 5, 6 and 7 are explanatory views showing the cut planes of piezoelectric single crystals and the propagating directions of surface acoustic waves.
Figure 6:
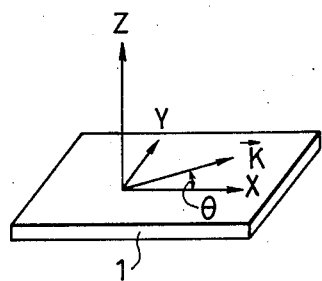
Figure 7:
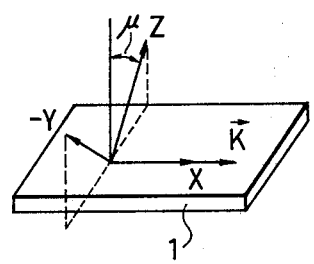
Figure 8:
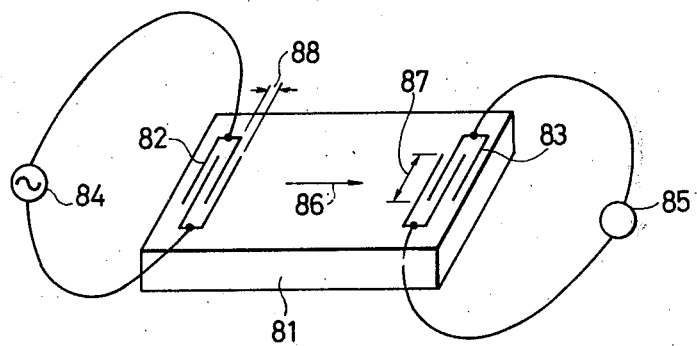
FIG. 8 is an explanatory view showing the structure of an SAW element in an embodiment of this invention.

From the single crystal materials of the six sorts of compositions thus obtained, there were respectively cut out crystal plates in orientations (i) in which angles $\mu$ in part (a) of FIG. 4 or $\mu$ in FIG. 5 were 45° and 15°, (ii) angles $\theta$ in part (b) of FIG. 4 or $\theta$ in FIG. 6 were 90°, 45° and 0°, and (iii) in which angles $\mu$ in part (c) of FIG. 4 or $\mu$ in FIG. 7 were 45° and 90°. The thicknesses of the crystal plates were 0.5-2.0 mm. One surface of each plate was polished to a mirror finish, Al was deposited thereon approximately 8,000 Å by the vacuum evaporation, and two, usual interdigital electrodes 82 and 83 were formed at a spacing of 3 mm by the photolithography as shown in FIG. 8. The number of pairs in each electrode was 15 (only 2 pairs are shown in FIG. 8), the aperture width 87 was 3 mm, the electrode width (the width of each finger) was 10 μm, and the finger pitch 88 was 20 μm. Numeral 81 indicates the crystal plate. After the single-crystal plates of the respective compositions were fixed in can packages with a silver paste, gold wires were bonded and interconnected by ultrasonic waves. Thus, a large number of SAW elements were fabricated. Each element was used as a frequency filter device in such a manner that one electrode 82 was employed as an input electrode (i.e., transmitter electrode for Rayleigh waves), while the other electrode 83 was employed as an output electrode (i.e., receiver electrode for the Rayleigh waves).

The SAW velocity can be calculated from a phase characteristic within a pass band of signals. The electromechanical coupling factor can be calculated from an SAW reflection characteristic or impedance characteristic in each electrode. Further, the temperature coefficient of delay time can be calculated from the temperature-dependent changes of the center frequency of the filter. These are all methods of calculations well known in the art.

The center frequencies of the filter elements fabricated were 65-70 MHz. The SAW velocities, electromechanical coupling factors and delay time-temperature coefficients of the respective elements were assessed by the aforecited methods. The results are indicated in FIG. 4. Numerals 12, 13, 14, 15 and 16 designate the SAW velocities of the elements employing the single-crystal plates in which $x=0.3$, 0.5, 0.6, 0.8 and 1.0, respectively. Numerals 22, 23, 24, 25 and 26 designate the electromechanical coupling factors of the elements employing the single-crystal plates in which $x=0.3$, 0.5, 0.6, 0.8 and 1.0, respectively. Numerals 32, 33, 34, 35 and 36 designate the delay time-temperature coefficients of the elements employing the single-crystal plates in which $x=0.3$, 0.5, 0.6, 0.8 and 1.0, respectively.

For reference sake, the characteristics of $Ba_2TiSi_2O_8$ are also written in FIG. 4. Broken lines 11, 21 and 31 are curves indicative of the characteristics of $Ba_2TiSi_2O_8$, and they are based on data contained in "H. Yamauchi; Journal of Applied Physics, Volume 49, page 6162 (1978)".

In case where $x=1.2$, the data were close to the curves 16, 26 and 36 though not mentioned in FIG. 4.

All the filter elements except those corresponding to the case of $\mu=45°$ in the part (a) of FIG. 4 demonstrated the satisfactorily practicable filter functions of insertion losses of about 15 dB, 3 dB band-widths of approximately 4.4 MHz and attenuations-out-of-band of about 40 dB.

As apparent from FIG. 4, the delay time-temperature coefficients of the filter elements fabricated are as good as 20-50 ppm/°C., and the electromechanical coupling factors are as sufficiently great as 1.5-2.0%.

Obviously many modifications and variations of the present invention are possible in the light of the above teachings. It is therefore to be understood that within the scope of the appended claims the invention may be practiced otherwise than as specifically described.

What is claimed is:

1. A piezoelectric single crystal characterized by having a composition which is represented by a general formula $(Ba_{2-x}Sr_x)TiSi_2O_8$ and in which the value x lies within a range of $0.25 \leq x \leq 1.2$.

2. A piezoelectric single crystal as defined in claim 1, characterized in that the value x lies within a range of $0.5 \leq x \leq 1.0$.

* * * * *